Figure 1:
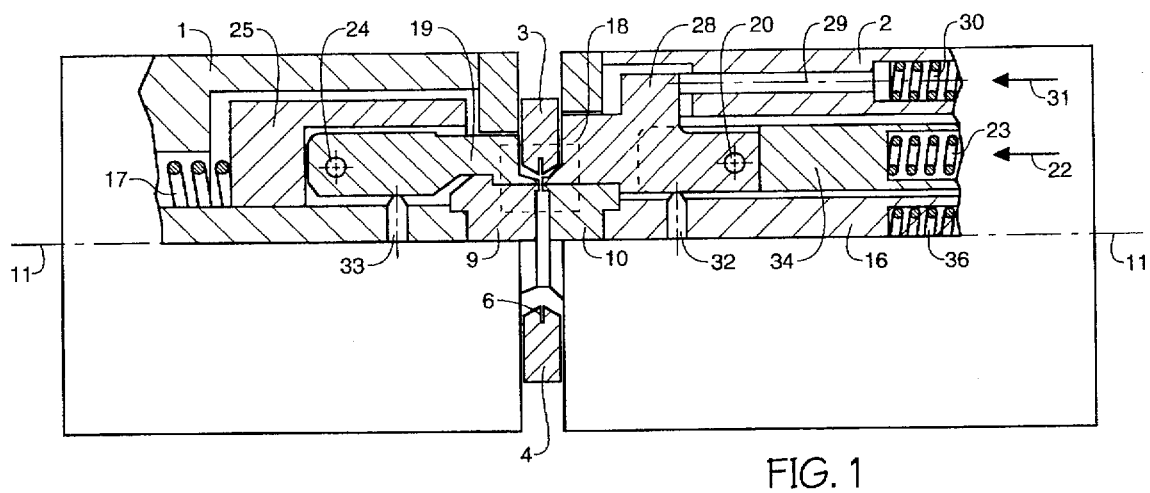

United States Patent [19]

Hinterlechner

[11] Patent Number: 5,715,872
[45] Date of Patent: Feb. 10, 1998

[54] PROCESS AND DEVICE FOR THE SHAPING OF LEADS OF INTEGRATED CIRCUITS

[75] Inventor: Gerhard Hinterlechner, Pforzheim, Germany

[73] Assignee: Micron Technology, Inc., Boise, Id.

[21] Appl. No.: 416,888

[22] PCT Filed: Oct. 13, 1993

[86] PCT No.: PCT/EP93/02819

§ 371 Date: Sep. 7, 1995

§ 102(e) Date: Sep. 7, 1995

[87] PCT Pub. No.: WO94/09510

PCT Pub. Date: Apr. 28, 1994

[30] Foreign Application Priority Data

Oct. 14, 1992 [DE] Germany ............... 42 34 697.5

[51] Int. Cl.⁶ .......................................... B21F 45/00
[52] U.S. Cl. ......................................... 140/105
[58] Field of Search ................................ 140/105

[56] References Cited

U.S. PATENT DOCUMENTS 4,977,442 12/1990 Suzuki et al. ................. 357/70
5,094,982 3/1992 Suzuki et al. ................. 437/209
5,158,121 10/1992 Ishii ............................. 140/105
5,283,946 2/1994 Simmons et al. .............. 140/105

FOREIGN PATENT DOCUMENTS 0330512 8/1989 European Pat. Off. .
513425A1 5/1991 European Pat. Off. .
4334861.0 10/1993 Germany .
4343305.7 12/1993 Germany .
61095560 5/1986 Japan .
1309725 12/1989 Japan .

OTHER PUBLICATIONS

IBM Technical Disclosure Bulletin, vol.28 No. 7, Dec. 1985, "Integrated Circuit Lead–Forming Mechanism".

Primary Examiner—Lowell A. Larson

[57] ABSTRACT

Method and apparatus for forming the lead-outs (14) of integrated circuits from which lead-outs (14) which are positioned in a common plane (21) are protruding, are bent in that they are gripped close to their free tips and then are positively moved along a curved path which is situated in a plane extending perpendicular to said common plane (21) and comprising the respective ones of the lead-outs (14) while the lead-outs (14) maintain to be clamped.

10 Claims, 3 Drawing Sheets

PROCESS AND DEVICE FOR THE SHAPING OF LEADS OF INTEGRATED CIRCUITS

The invention concerns method and apparatus for forming lead-outs of integrated circuits.

Integrated circuits (ICs) are mainly constructed on support strips and are injection molded with a plastic casing. The structures of the leads are formed, by etching or punching, on the support strip which consists of a metal band. The leads are arranged in a common plane at the sides of the casing. In order to solder the integrated circuits onto a circuit support board, the leads, initially in a level position, must be bent into a suitable shape. At that point the casings are still connected via bridges at their corners to the support strip. The greater the number of leads on the integrated circuit and the closer these leads are arranged to each other, the greater are also the precision requirements during the bending process, since even very small deviations from the required bending angles and lopsided positions of the leads will result in faulty contacts on the circuit support board. The bending tools for the leads are therefore precision tools. Modern highly integrated circuits having far more than one hundred leads require a very high precision of the bending tools.

The leads are mostly bent into Z-shapes having two approximately right angles. In order to obtain this, the leads are usually clamped, close to the casing, against a bending matrix and are initially bent downwards in a sloping manner at an angle of approximately 45 degrees by means of a bending die, against the complementary bending surface of the matrix. The integrated circuits, still connected to the lead frame, are then guided to an adjacent swage where the leads are bent between a bending matrix and slanting bending dies into their final position. In order to obtain this, the bending matrix has a form accommodating the desired Z-shape of the leads; an upper die, its tip positioned towards the apex of the bending matrix form, pushes from above in a slanting manner into the bending matrix form, thereby pushing the leads into the indentation of the matrix' bending form. It is inevitable that during this process a relatively high surface compression between the leads and the bending tool as well as friction resulting from the relative movement between the leads and the tool results in a rubbing-off of tin, which at this point is already coating the leads prior to the subsequent soldering process. The rubbed-off tin is deposited on the tool, with the result that the tool, costing more than DM 100,000.00 has to be changed and cleaned already after a relatively short time, i.e. after a few thousand strokes of the tool. At a working speed of two strokes per second, 1000 strokes take only 8 minutes, so that several operators are constantly required for each machine in order to clean the tool, as well as several sets of tools. This results not only in high personnel and machinery costs, but also in relatively long standstill periods due to the frequent changes of tools; therefore resulting in a considerably more expensive manufacture of chips, quite apart from the fact that each change of tools may lead to damage of the integrated circuits or of the tool itself, due to possible faulty adjustment during assembly. If greater tin deposits on the bending tool are tolerated so as to avoid a too frequent change of tools, the precision of the bending process will be affected with the result that not all the bent ends of the leads are positioned in a common plane, which is absolutely necessary for soldering them onto a circuit support board. Furthermore, in the case of the already-known bending devices, it is possible that during the bending process itself individual leads, groups of leads or even all the leads may be bent in a way not vertical to the original common plane of the leads, but slanting towards it, especially when the leads, formed by etching, have a profile deviating from the usual rectangular shape. This results in a faulty position of the bent ends of the leads, especially an inadequate coplanarity as well. It is not possible to compensate for this faulty positioning during the equipping of circuit support boards via an automatic equipper. Therefore manufacturers of chips will go to rather a lot of trouble and expense in order to check and to correct, if necessary, the exact position of the bent ends of the leads (cf. J.: "SEMICONDUCTOR INTERNATIONAL", May 1992, pages 86–90, especially page 90, middle column, penultimate paragraph).

It is the task of the present invention to increase precision during the bending of leads of integrated circuits, and to decrease the necessity of tool changes in order to remove tin deposits on the bending parts of the tools.

This task is solved by method and apparatus for forming lead-outs of integrated circuits. The sub-claims are concerned with further advantageous developments of the invention.

The present invention constitutes a break from the usual process of forming the leads within a swage where they are merely pushed by means of a bending die into an indentation of a matrix form; instead the free ends of the leads are clamped by means of a clamping tool, and the clamped ends of the leads are then force-guided along a curved path, without any deviations to the side. In this way the lead ends, which must be placed in a precisely determined position in a common plane so as to enable the automatic soldering of the integrated circuits onto circuit support boards, are force-guided by means of the clamping tool and there is no possibility of their deviating sideways during the bending process—different from the present state of technology—, so that they will inevitably reach their pre-determined position. There is no displacement, no relative movement and thus no friction between the tool and the leads, since bending is carried out by means of the clamping tool which holds the lead ends securely. Compared to the operating method of the present state of technology, with this method there is practically no danger of tin being rubbed off the leads and deposited on the tool, so that the working periods before cleaning of the tool may become necessary eventually are very much longer when compared to the working periods of the present state of technology. The expense necessary for cleaning the tools is therefore extremely negligible, and the same is true for the standstill periods (readjustment periods) of the machine, caused by the need for cleaning. Furthermore, since the lead ends are force-guided, it is highly unlikely that after the bending they will end up in a faulty position, which is caused by irregular profiles of the leads, since any deviations are prevented by the forced guiding of the lead ends. Subsequent corrections of faulty positions of the leads resulting in higher expenditure at the present state of technology are a thing of the past when utilizing the present invention.

When utilizing the present invention it is generally possible to bend the leads in free space, fixed on one side by clamping within the clamping tool which is force-guided laterally, and on the other side by the pick-up part of the integrated circuit casing, whereby the leads may be clamped in a section adjoining the edge of the integrated circuit casing as well, in order to protect the casing. In this way the bending tensions are not transmitted to the casing.

Since in most cases the leads are to be bent into a Z-shape, the clamping tool is preferably guided in such a way that the alignment of the clamped lead ends is maintained while they are forced sideways along the curved path, i.e. the lead ends remain parallel to the common plane which was their original position.

The leads are usually somewhat irregular, due to the tin coating. In order to ensure, however, that the leads are firmly gripped simultaneously on all four sides of the integrated circuit casing, it is preferable that the leads on all four sides of the casing should not be gripped and bent together, but separately and independently of the other sides, and by using separate clamping tools.

The device according to the invention utilizes a clamping tool consisting of two jaws acting on the lower and upper surface of the leads, adjacent to the pick-up part of the casing. They are arranged around axes parallel to the common plane, where the leads are originally positioned, as well as at right-angles to the longitudinal direction of the leads, whereby the axes are positioned in such a way that they are able to move crosswise to the common plane, not individually against each other, but together while still maintaining the clamping. The common plane where the leads are originally positioned is indirectly present in the device according to the invention, defined by the mechanism for picking up the casing in a predetermined position.

The longitudinally movable positioning of the jaws combined with their swivelling positioning causes them to inevitably move along a curved path after they have clamped the lead ends and are then shifted, because the jaws "hang" from the leads which they have clamped just like from a lasso. Disengagement of the bending jaws during the bending process causes an increase of forces in the direction of the bending movement due to the elbow lever effect on the bending jaws, in order to further carry out the bending process. Additional guiding means for the clamping tool are not required, so that therefore the construction of the device according to the invention is very simple.

Even though it is basically possible to bend the leads in free space, it is, however, preferable that each bending jaw is provided with a bending surface arranged adjacent to its clamping surface and pointing towards the mechanism for picking up the casing, in order to obtain a repeatable, regular bending process resulting in each lead having the same shape as the others; during the bending process the leads are able to sit closely adjacent to the bending surface so that this surface, preferably of convex shape, will determine the shape of the bent leads. Preferably, the bending surface interacts with a counter-form having a surface area complementary to the bending form; the bending surface of the bending jaw is moved towards this complementary surface area so that at the end of the bending process the leads are clamped between the bending surface and the complementary surface area, whereby the central area of the leads as well is inevitably given a predetermined shape, without, however, any friction occurring between the leads and the bending surface on one side and the complementary surface area on the other side; thus the advantages of the invention, resulting from the forced guidance of the clamped lead ends, are fully maintained.

It is practical that the complementary surface area is positioned at the mechanism for picking up the casing and shaped as a bending matrix form.

In order to activate the bending process by shifting the jaws longitudinally, it is not necessary that both jaws have their own active mechanism, it is sufficient if only one of the jaws is movable via an active mechanism and the other jaw is flexibly positioned so that it will yield to spring tension, for example, when the first jaw advances. Naturally the spring tension has to be sufficient in order to hold the lead ends securely between the jaws. It is practical that the jaw provided with the bending surface is movable via the active mechanism. Preferably, this jaw is additionally provided with a swivel drive which enables the jaw to be further pushed towards the mechanism for picking up the casing as well as the bending matrix form. This swivel drive is not needed for moving the clamping tool consisting of the two jaws along the predetermined curved path, but, after the bending process has essentially been completed and the leads are positioned between the bending surface and its complementary surface, it serves to push further or even to over-bend somewhat, if this is expedient or desired for a particular use. The swivel drive is preferably cushioned so as to protect the leads and tools. Thus the forces occurring may easily be determined via the spring tension.

Preferably the jaws are provided with a release spring each, so that they can automatically swivel back to their original position after completion of the bending process.

It has already been mentioned that the leads protruding from a common side of the casing are preferably to be gripped and bent together, but separately from the leads on the other sides. This requires, in a further development of the invention, that four pairs of jaws positioned according to the invention are provided for one casing with leads protruding from its four sides. The lead ends on one side may still be connected to a common bridge which is separated after the shaping. For a compact as well as simple tool construction, those jaws positioned at the same side as the plane of the leads are arranged and guided, together with the die positioned at that same side, with a common casing.

Instead of gripping and bending the leads between jaws able to swivel, jaws may of course be used which are able to move in the longitudinal direction of the leads as well as across it, i.e. by placing the jaws between two additional, outer jaws and positioning them therein in such a way that they are able to move longitudinally, while the outer jaws are able to move across.

Diagrams of two models of the invention are shown in the enclosed drawings.

Figure 2:
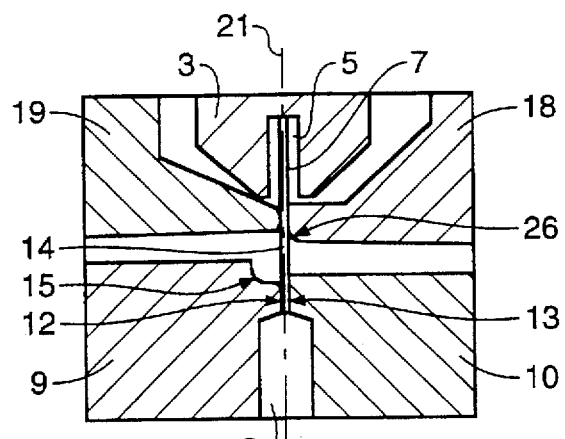
Figure 3:
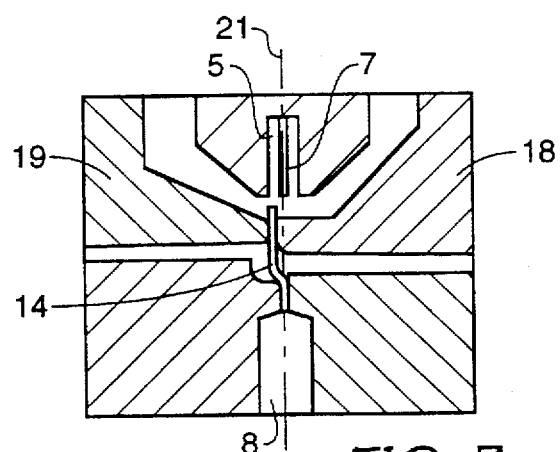
Figure 4:
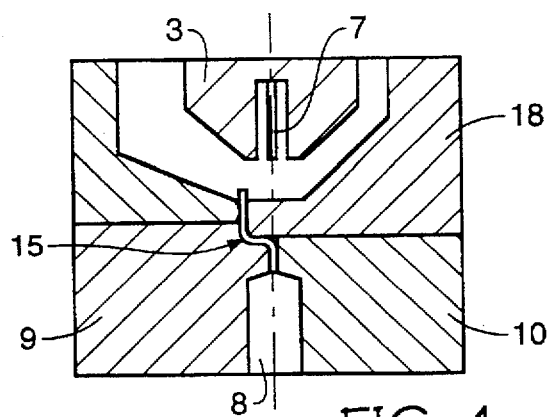
Figure 5:
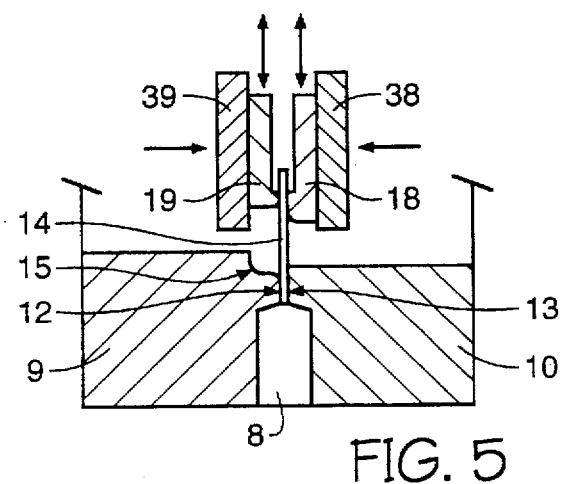

FIG. 1 shows a partial section of a device according to the invention, whereby the sectional plane is vertical to the common plane of the leads, FIG. 2 shows as detail Z from the representation according to FIG. 1 the central area of the device including the clamping tool and the mechanism for picking up the IC-casing and with the IC displayed, prior to the bending of the leads, FIG. 3 shows in a representation as in FIG. 2 the arrangement of the tools during the bending process, FIG. 4 shows in a representation according to FIG. 2 the arrangement of the tools when the bending process is completed, and FIG. 5 shows a diagrammatical view according to FIG. 2 of the arrangement of the tools, with a variation of the clamping tool.

The device shown in FIG. 1 is provided with two guiding casings 1 and 2, arranged at a distance from each other. Both guiding casings 1 and 2 are arranged at a common tool guide and can be moved independently of each other in the longitudinal direction (arrows 48 and 49). Two guiding rails 3 and 4, with slits 5 and 6 facing each other and running vertically to the drawing plane, serve to guide a leadframe at both its longitudinal edges and are provided in the space between the two casings.

In order to pick up the casing 8, made of plastic and connected to the leadframe, in the predetermined position, a casing pick-up device 9 is provided within the guiding casing 1 and a casing pick-up device 10 is provided within the guiding casing 2. The pick-up device 10 can be moved along the longitudinal axis 11 of the arrangement against a spring tension. The edges 12 and 13 of the pick-up devices 9 and 10 grip the edge of the casing and clamp the leads at their exit from the casing. This clamped section is not available for the bending process.

Adjacent to its clamping surface, the casing pick-up device 9 is provided with a form 15, into which the centre sections of the leads 14 are bent, so that the shape of form 15 determines the future shape of the leads 14 in this area. Thus form 15 simultaneously constitutes the bending matrix.

In order to pick up the casing 8 and to clamp the leads 14 the casing pick-up device 9 comes up to the casing via an operating mechanism and is held in this position. The casing pick-up device 10 then comes up via the tappet 16 whose reverse side is cushioned by a spring 33; thus the leads 14 are clamped close to the edge of the casing.

To bend the leads 14, a movable clamping tool having two jaws 18 and 19 for each side of the casing is provided, these jaws grip the leads 14 near their ends, clamping the ends between them. Jaw 18 is positioned within the jaw guide 34 and is able to swivel around an axis 20 running parallel to the original common plane 21 and at right angles to the longitudinal direction of the leads 14.

At the same time jaw guide 34 and thus axis 20, and together with axis 20 also jaw 18, are supported from behind—symbolically indicated by arrow 22—by an active mechanism, e.g. a compression agent cylinder or a driven curved disc, via a spring 23, movable in the longitudinal direction 22 against the other jaw 19. As for jaw 19, it is positioned within the jaw pick-up 25 and able to swivel around an axis 24, parallel to axis 20. The clamping force (counter force) is brought to bear upon the jaw pick-up 25 via spring 17, so that jaw 19 is also cushioned by spring 17.

The area of the edge of jaw 18 opposite form 15 serves as the bending surface 26 and thus has a shape (form) complementary to indentation 15.

The side of jaw 18 is provided with a projection 28 whose reverse side is affected by the action of a tappet 29, arranged parallel to axis 11; this tappet can be advanced, when a spring 30 is added, by means of an active mechanism (not represented, just indicated by arrow 31), for example a compression agent cylinder, whereby spring force 30 is additionally brought to bear upon the jaw which is then able to swivel further.

Operation of the device is as follows:

When due to the advance of leadframe 7, a casing 8 is positioned exactly between the casing pick-up devices 9 and 10, it is securely clamped between them, then advances due to the active mechanism 22 of the bending jaws 18 and the free ends of the leads 14 are clamped between jaws 18 and 19. As jaw 18 continues to advance, jaw 19 retreats towards the spring force of spring 17 and both jaws, since they hang from the leads 14 due to the clamping and are positioned in a swivelling manner, perform a curved movement resulting in the bending of the center area of the leads (FIG. 3). Due to the disengagement of both jaws 18 and 19 during the bending process, the forces in the direction of the bending movement are increased, due to the elbow lever effect on the jaws, in order to further carry out the bending process. Thereby the leads initially continue to sit closely adjacent to the bending surface 26 which pushes them at the end of the bending process into the complementary bending form of the matrix 15 of the bending matrix 9 (FIG. 4), whereby a further pushing, via the active mechanism 31, of the bending surface 26 into the indentation 15 may occur at this moment.

The bending jaws 18 and the clamping piece 10 are now retracted, so that the jaws 18 and 19 are no longer performing any clamping, but swivel back to their original position by means of spring pistons 32 and 33 positioned diagonally to the jaws. As soon as the die 10 has been retracted far enough, lead frame 7 with the casing 8 suspended therein advances further and the next casing, following in the lead frame, is placed into position for the bending process.

In the case of the model shown in FIG. 5, those parts corresponding to parts of the first model have been given corresponding reference numbers. The model according to FIG. 5 differs from the model shown in FIG. 2 in that the jaws 18 and 19 clamping the leads 14 between them are not positioned in a way that enables them to swivel, but are positioned in such a way between an additional pair of jaws 38 and 39, which clamp the jaws 18 and 19 between them, that they can move longitudinally, i.e. are movable in the longitudinal direction of the leads. The outer jaws 38 and 39 themselves are movable, at a right angle to the plane of the leads 14. When they are shifted in this direction by means of die 10 towards die 9, the clamped leads 14, due to the maintained clamping, will draw jaws 18 and 19 forward a little, from the jaws 38 and 39, until the leads 14 are pushed into indentation 15. Jaws 18 and 19 may be positioned in a movable manner on needles, for example, so as to ensure that they encounter only minimal friction within jaws 38 and 39.

I claim:

1. A method for shaping lead-outs of an integrated circuit, the method comprising the steps of:
   clamping a proximal portion of at least one of the lead-outs between a first and a second casing;
   clamping a distal portion of at least said one of the lead-outs between a first and a second jaw; and
   bending a central portion of at least said one of the lead-outs to a bending form defined by the second casing, said bending comprising the step of:
   pivoting the first jaw about an axis operatively parallel to a plane defined by at least said one of said lead-outs to press at least a part of the central portion to the bending form.

2. A method for shaping lead-outs of an encased integrated circuit, the method comprising the steps of:
   clamping a proximal portion of a group of the lead-outs between a first and a second casing, the second casing defining a bending recess;
   clamping a distal portion of the group of the lead-outs between a first and a second jaw; and
   bending a central portion of the group of the lead-outs to the bending recess, said bending comprising the step of:
   pivoting the first jaw through a plane defined by the group of the lead-outs;
   pivoting the second jaw away from the plane; and
   pressing at least a part of the central portion of the group of the lead-outs to the bending recess;
   the first and the second jaw pivoted about first and second axes, respectively;
   said first and second axes operatively parallel to said plane.

3. A method for shaping lead-outs of a packaged integrated circuit, the method comprising the steps of:
   clamping a proximal portion of a group of the lead-outs between a first and a second casing, the second casing defining a bending recess;
   clamping a distal portion of the group of the lead-outs between a first and second jaw in which a bending surface defined by the first jaw is engaged to at least an extent of a central portion of the group of the lead-outs, the bending surface a complement of the bending recess; and bending the central portion of the group of the lead-outs to the bending recess, said bending comprising the step of:

pivoting the first jaw longitudinally through a vertical orientation of the group of the lead-outs defining a plane;

pivoting the second jaw longitudinally away from the vertical orientation; and forming the central portion to the bending recess;

the first and the second jaw pivoted about first and second axes, respectively;

the first and the second axes parallel to each other and to said plane.

4. A method for shaping lead-outs of a cased integrated circuit, the method comprising the steps of:

clamping a proximal portion of a group of the lead-outs between a first and a second casing pick-up device, the second casing pick-up device defining a bending recess;

clamping a distal portion of the group of the lead-outs between a first and a second to engage a bending surface defined by the first jaw to an extent of a central portion of the group of the lead-outs, the bending surface a complement of the bending recess; and bending the central portion of the lead-outs to the bending recess, said bending comprising the steps of:

pivoting the first jaw longitudinally through a vertical orientation of the group of the lead-outs defining a plane;

pivoting the second jaw longitudinally away from the vertical orientation; and the first and the second jaw pivoted about a first and a second axis, respectively, each of which is parallel to said plane;

pressing the central portion between the bending surface and the bending recess in response to said pivoting of the first and the second jaw.

5. An apparatus for shaping lead-outs of an integrated circuit, the apparatus comprising:

a first and a second casing configured to receive a first portion of a group of the lead-outs therebetween, the second casing defining a bending form; and a first and a second jaw configured to receive a second portion of the group of the lead-outs therebetween, the first jaw defining a bending surface, the first and the second jaw configured to pivot about an axis operatively parallel to a plane defined by said group of the lead-outs.

6. An apparatus for shaping lead-outs of an encased integrated circuit, the apparatus comprising:

a first and a second casing configured to clamp a first portion of a group of the lead-outs therebetween, the second casing defining a bending recess;

a first and a second jaw configured to clamp a second portion of the group of the lead-outs therebetween, the first jaw defining a bending surface complementary to the bending recess, the first and the second jaw configured to pivot about an axis operatively parallel to a plane defined by the group of the said lead-outs; and a guide rail configured to receive a distal end of the second portion of the group of the lead-outs.

7. An apparatus for shaping lead-outs of a packaged integrated circuit, the apparatus comprising:

a first and a second casing pick-up device configured to clamp a proximal portion of at least one of the lead-outs therebetween, the second casing pick-up device defining a bending recess;

a first and a second jaw configured to clamp a distal portion of at least said one of the lead-outs therebetween, the first jaw defining a bending surface complementary to the bending recess, the first and the second jaw configured to pivot about an axis parallel to a plane defined by at least said one of said lead-outs;

a guide rail configured to receive a distal end of the distal portion of at least said one of the lead-outs; and a tappet configured to exert force on the first casing pick-up device.

8. An apparatus for shaping lead-outs of a cased integrated circuit, the apparatus comprising:

a first and a second casing pick-up device configured to clamp a proximal portion of a group of the lead-outs therebetween, the second casing pick-up device defining a bending recess;

a first and a second jaw configured to clamp a distal portion of the group of the lead-outs therebetween, the first jaw defining a bending surface complementary to the bending recess, the first and the second jaw each configured to pivot about respective axes, each said axes parallel to a plane defined by said group of said lead-outs;

a guide rail configured to receive a distal end of the distal portion of said group of the lead-outs;

a tappet operable on the first casing pick-up device to at least partially exert clamping force thereon; and a spring operable on the first jaw to at partially exert clamping force thereon.

9. A method for shaping lead-outs of a packaged integrated circuit, the lead-outs having lead ends, the method comprising the steps of:

clamping a proximal portion of a group of the lead-outs between a first and a second pick-up part;

clamping a distal portion of the group of the lead-outs between a first and a second jaw; and bending a central portion of the group of the lead-outs to a bending form defined by the second pick-up part, said bending comprising the steps of:

pivoting the first jaw through a plane defined by the group of said lead-outs about an axis parallel to said plane, the lead ends of the group of said lead-outs remaining parallel to said plane throughout said pivoting, the distal portion moved crosswise to said plane in response to said pivoting; and pressing at least a part of the central portion of the group of the lead-outs to the bending form in response to said pivoting of the first jaw.

10. For a packaged integrated circuit having a plurality of sides with lead-outs, the lead-outs having lead ends, a method for shaping the lead-outs comprising the steps of:

clamping, between sets of pick-up parts, proximal portions of the lead-outs located on differing sides of the plurality of sides;

clamping between sets of jaws, distal portions of the lead-outs located on the differing sides; and bending central portions of the lead-outs on the differing sides to bending forms defined by the sets of pick-up parts, said bending comprising the steps of:

pivoting the sets of jaw about axes parallel to planes defined by said lead-outs on the differing sides, the lead ends remaining parallel to said plane throughout said pivoting, the distal portions moved crosswise to said planes in response to said pivoting; and pressing at least a part of each of the central portions of the lead-outs to the bending forms in response to said pivoting.

* * * * *